United States Patent
Sharma et al.

(10) Patent No.: US 8,958,238 B2
(45) Date of Patent: Feb. 17, 2015

(54) LOCAL WRITE AND READ ASSIST CIRCUITRY FOR MEMORY DEVICE

(71) Applicants: Stichting IMEC Nederland, Eindhoven (NL); Katholieke Universiteit Leuven, Leuven (BE)

(72) Inventors: Vibhu Sharma, Eindhoven (NL); Stefan Cosemans, Mol (BE); Wim Dehaene, Kessel-Lo (BE); Francky Catthoor, Temse (BE); Maryam Ashouei, Eindhoven (NL); Jos Huisken, Waalre (NL)

(73) Assignees: Stichting IMEC Nederland, Eindhoven (NL); Kathoieke Universiteit Leuven, Leuven (BE)

( * ) Notice: Subject to any disclaimer, the term of this patent is extended or adjusted under 35 U.S.C. 154(b) by 0 days.

(21) Appl. No.: 14/015,822

(22) Filed: Aug. 30, 2013

(65) Prior Publication Data
US 2014/0071737 A1    Mar. 13, 2014

Related U.S. Application Data

(63) Continuation of application No. PCT/EP2012/053757, filed on Mar. 5, 2012.

(60) Provisional application No. 61/449,425, filed on Mar. 4, 2011.

(51) Int. Cl.
*G11C 11/419* (2006.01)
*G11C 11/412* (2006.01)
*G11C 7/18* (2006.01)

(52) U.S. Cl.
CPC ............ *G11C 11/419* (2013.01); *G11C 11/412* (2013.01); *G11C 7/18* (2013.01)
USPC ...................................... 365/156; 365/189.16

(58) Field of Classification Search
CPC ..................... H01L 27/11582; G11C 16/0483; G11C 16/00; G11C 16/10; G11C 16/26; G11C 11/419; G11C 11/412; G11C 7/18; G06F 11/1469; G06F 1/3203
USPC ........... 711/105; 257/E27.062, 369; 327/108; 365/156, 189.16
See application file for complete search history.

(56) References Cited

U.S. PATENT DOCUMENTS

2002/0174291 A1 * 11/2002 Hsu et al. ....................... 711/105
2005/0174870 A1 *  8/2005 Yamauchi ...................... 365/222

(Continued)

FOREIGN PATENT DOCUMENTS

WO    WO 2012/119988    9/2012

OTHER PUBLICATIONS

R. Jacob Baker, CMOS circuit design, layout, and simulation, Copyright 2005, Wlley-interscience, Second Edition, p. 344,345,346,347.*

(Continued)

*Primary Examiner* — Hoai V Ho
*Assistant Examiner* — Tri Hoang
(74) *Attorney, Agent, or Firm* — Knobbe Martens Olson & Bear LLP

(57) ABSTRACT

A memory device having complementary global and local bit-lines, the complementary local bit-lines being connectable to the complementary global bit-lines by means of a local write receiver which is configured for creating a full voltage swing on the complementary local bit lines from a reduced voltage swing on the complementary global bit lines. The local write receiver comprises a connection mechanism for connecting the local to the global bit-lines and a pair of cross-coupled inverters directly connected to the complementary local bit lines for converting the reduced voltage swing to the full voltage swing on the complementary local bit lines.

18 Claims, 6 Drawing Sheets

(56) References Cited

U.S. PATENT DOCUMENTS

2009/0251974 A1* 10/2009 Chu et al. ............... 365/189.02
2010/0091590 A1* 4/2010 Takeda .................... 365/191
2010/0142258 A1* 6/2010 Tsai et al. ................ 365/154
2010/0165749 A1 7/2010 Wu et al.
2010/0260002 A1* 10/2010 Chen et al. .............. 365/207

OTHER PUBLICATIONS

International Search Report and Written Opinion dated Jun. 28, 2012, for International Application No. PCT/EP2012/053757.
International Preliminary Report on Patentability dated Jun. 18, 2013, for International Application No. PCT/EP2012/053757.

* cited by examiner

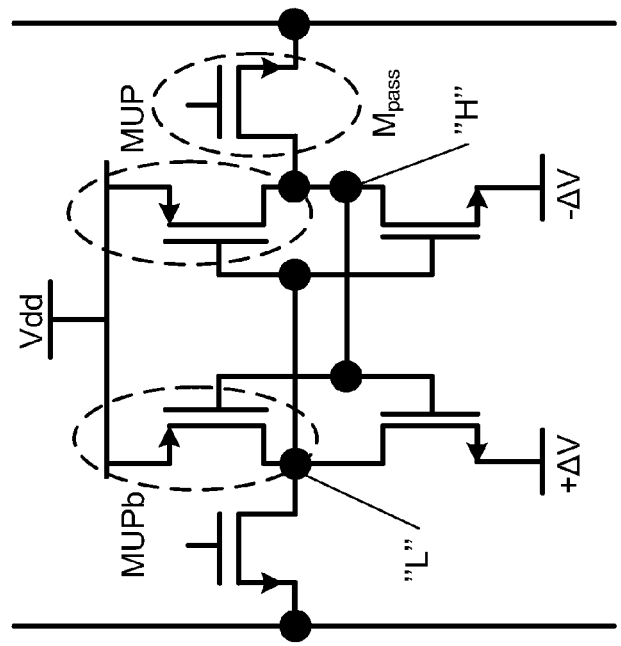
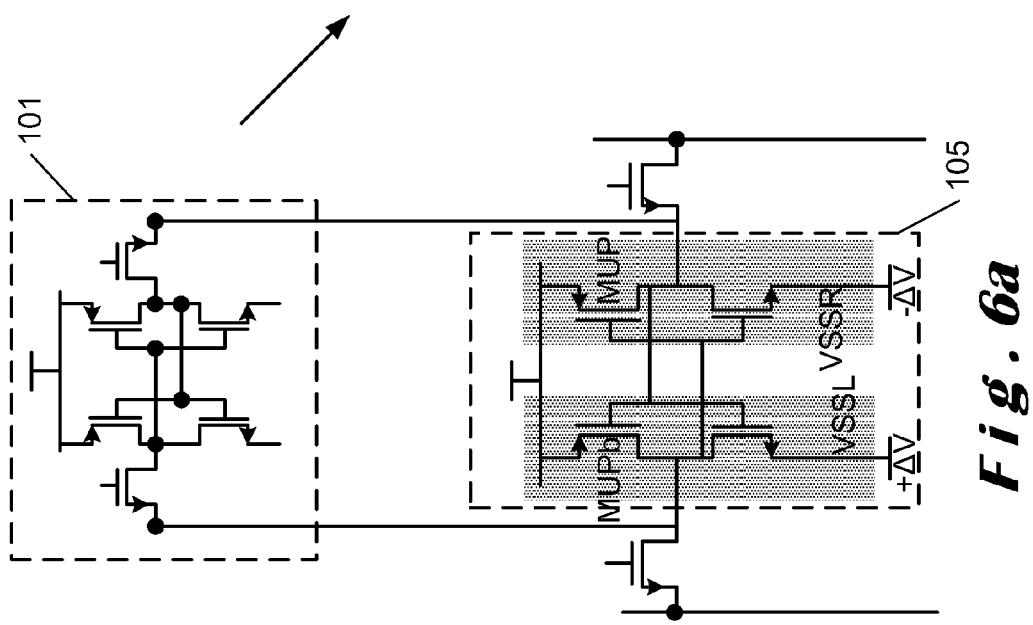
Fig. 6a
Fig. 6b dent claims.
LOCAL WRITE AND READ ASSIST CIRCUITRY FOR MEMORY DEVICE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 C.F.R. §1.57. This application is a continuation of PCT Application No. PCT/EP2012/053757, filed Mar. 5, 2012, which claims priority under 35 U.S.C. §119(e) to U.S. Provisional Patent Application No. 61/449,425, filed Mar. 4, 2011. Each of the above applications is incorporated herein by reference in its entirety.

BACKGROUND

1. Field

The present disclosure relates to memory devices, e.g. static random access memory devices, in particular local write and read assist circuitry for memory devices, and to electronic devices comprising these memory devices.

The present disclosure further relates to a method for writing a cell of a memory device, e.g. a static random access memory device.

2. Description of the Related Technology

In static random access memory (SRAM) it is desirable to save power. Low voltage operation is thus preferred. Although this reduces the power consumption, this can lead to a number of issues with, for example, process variability resilience, cell stability, read current, and write margin.

It is known to save, energy consumption during write operations by using a reduced voltage swing on the global bit lines and only a full voltage swing on the local bit lines. In order to convert the reduced voltage swing on the global to the full voltage swing on the local bit lines, which is needed to preserve the write margin, conventionally a strobed local write receiver (sense amplifier) is used. However, this approach has been found to have some disadvantages, in particular complex timing and associated power consumption.

DEFINITIONS

As used herein, with "local column" is intended to mean a segment or part of a memory block, e.g. a segment or part of a column of a memory matrix.

As used herein, with "full voltage swing" on complementary lines, e.g. local bit lines, is intended to mean a voltage difference substantially equal to the difference between a supply voltage level and a ground voltage level, e.g. a voltage difference of 1.0 to 1.2 V.

As used herein, with "reduced voltage swing" or "low voltage swing" on complementary lines, e.g. global bit lines, is intended to mean a voltage difference smaller, preferably significantly smaller than the full voltage swing, e.g. a voltage difference of less than half the supply voltage, e.g. a voltage difference of 0.1 to 0.2 V.

As used herein, lower case "b" after an uppercase abbreviation is the abbreviation of "bar" and is used to denote a complementary line or signal.

SUMMARY

It is a first aim of the present disclosure to provide a memory device and/or a method for writing a cell of a memory device, with which power consumption during write operations can be further reduced.

This aim is achieved according to the disclosure with a memory device and writing method according to the independent claims.

It is a second aim of the present disclosure to provide a memory device with improved process variability resilience.

It is a third aim of the present disclosure to provide a litho friendly local assist circuitry for a memory device.

In a first aspect, this disclosure provides a memory device having hierarchical bit-lines, in particular complementary global and local bit-lines, the complementary local bit-lines being connectable to the complementary global bit-lines by means of a write assist circuit, in particular a local write receiver which is configured for creating a full voltage swing on the complementary local bit lines from a reduced voltage swing on the complementary global bit lines. The local write receiver comprises:

- a connection mechanism for connecting the complementary local bit lines to the complementary global bit lines and thereby passing on said reduced voltage swing; and
- a pair of cross-coupled inverters directly connected to the complementary local bit lines for converting said reduced voltage swing, passed on by said connection mechanism, to said full voltage swing on said complementary local bit lines.

The disclosure is applicable to any memory device of the type having hierarchical bit-lines with complementary global bit-lines on which a reduced voltage swing is used to save energy consumption, to be converted to a full voltage swing on complementary local bit-lines. One example of such a type of memory device is static random access memory (SRAM). Another example of such a type of memory device is embedded dynamic random access memory (eDRAM).

The use of the pair of cross-coupled inverters in the local write receiver enables low energy write operations. The complex timing of the prior art can be resolved since only one enable signal, to write enable the column, can be used. Furthermore the transistor count can be reduced with respect to the conventional strobed local write receiver. The reduced timing complexity and the reduced transistor count can both have a positive effect on the power consumption during write operations. Furthermore, it has been found that in memory devices according to this disclosure, one can enable supply voltage scaling, i.e. operation at a reduced supply voltage with respect to prior art devices, which can further reduce power consumption.

In the case of SRAM, the first aspect of the disclosure can be worded as follows, though it should be noted that this disclosure is not restricted thereto:

a static random access memory (SRAM) device comprising at least one local column of memory cells, each local column comprising:

complementary local bit lines between which a plurality of said memory cells are connected, each cell comprising a pair of first cross-coupled inverters connectable via first access transistors to said complementary local bit lines for writing the cell, the gates of the first access transistors of each cell being connected to a word line for addressing the cell;

a local write receiver via which said complementary local bit lines are connectable to complementary global bit lines, said local write receiver being configured for creating a full voltage swing on said complementary local bit lines from a reduced voltage swing on said complementary global bit lines, the local write receiver comprising:

second access transistors (forming the connection mechanism described above) for connecting said complementary local bit lines to said complementary global bit lines and thereby passing on said reduced voltage swing, the gates of the second access transistors being connected to a local column write enable line (WL_WR) for receiving a local column write enable signal; and a pair of second cross-coupled inverters directly connected to said complementary local bit lines for converting said reduced voltage swing, passed on by said second access transistors, to said full voltage swing on said complementary local bit lines.

In embodiments according to the disclosure, the second cross-coupled inverters may be upsized with respect to the first cross-coupled inverters. For example, the transistors of the second cross-coupled inverters may be twice the size of the transistors of the first cross-coupled inverters. This can help to ensure that a full voltage swing can be achieved on the local bit lines.

In embodiments according to the disclosure, the SRAM device may comprise a timing signal generator provided for generating a pulsed signal as said column write enable signal. The pulsed signal can isolate the nodes of the second cross-coupled inverters from the global bit lines, which may be highly capacitive.

In embodiments according to a second aspect of the disclosure, which may be combined with the other aspects described herein but may also exist independently therefrom, the second cross-coupled inverters of the local write receiver, and possibly also the first cross-coupled inverters of the cells, may have connections to left and right ground rails for receiving left and right VSS biases. A VSS biasing circuit may be provided, configured for applying said left and right VSS biases to said left and right ground rails, wherein the VSS biasing circuit may be provided for establishing a predetermined, data dependent voltage difference between the left and right VSS biases. This approach, herein called "differential VSS bias" (DVSS), can mitigate the impact of increased device parameter variations, i.e. can enable to use smaller transistors without risking malfunction as a result of manufacturing process variations. In addition, in the case of SRAM, DVSS bias application, as it is data dependent, can increase the write margin and thus ensure write-ability for the addressed SRAM cell. This can further enable operation at lower supply voltage and hence further reduce power consumption.

In embodiments according to the disclosure, the complementary local and global bit lines may be combined read and write bit lines, i.e. read and write operations are performed using the same bit lines, as is common in e.g. 6T SRAM devices.

In other embodiments according to the disclosure, the device may comprise separate local and global read and write bit lines, i.e. read and write operations are performed using dedicated bit lines, as is common in e.g. 8T SRAM devices.

In embodiments according to a third aspect of the disclosure, which may be combined with the other aspects described herein but may also exist independently therefrom, the pair of first cross-coupled inverters of each memory cell is connectable via a cell read buffer to a local read bit line and the local read bit line is connectable via a local read buffer to a global read bit line, wherein the local read buffer comprises two stacked NMOS transistors. So when combined with the second cross-coupled inverters as local write receiver, a structure is achieved in which the read and write assist circuitry of the local column resembles an SRAM cell structure, e.g. an 8T SRAM cell structure. The advantage is that the design rules for SRAM cells can be applied instead of design rules for logic gates, the latter requiring more area, so that area can be saved and a litho friendly structure can be achieved.

In other embodiments according to the disclosure, the two stacked NMOS transistors of the local read buffer may be upsized with respect to the NMOS transistors in the cell read buffers, which may in turn be two stacked NMOS transistors.

In other embodiments according to the disclosure, the two stacked NMOS transistors of the local read buffer may be configured for reduced threshold voltage operation with respect to the NMOS transistors in the cell read buffers.

BRIEF DESCRIPTION OF THE DRAWINGS

The disclosure will be further elucidated by means of the following description and the appended figures.

FIGS. 6a and 6b explain how differential VSS biasing can reduce mismatch offset of the local write receiver and simultaneously improve the write margin for an SRAM cell.

DETAILED DESCRIPTION

Figure 1:
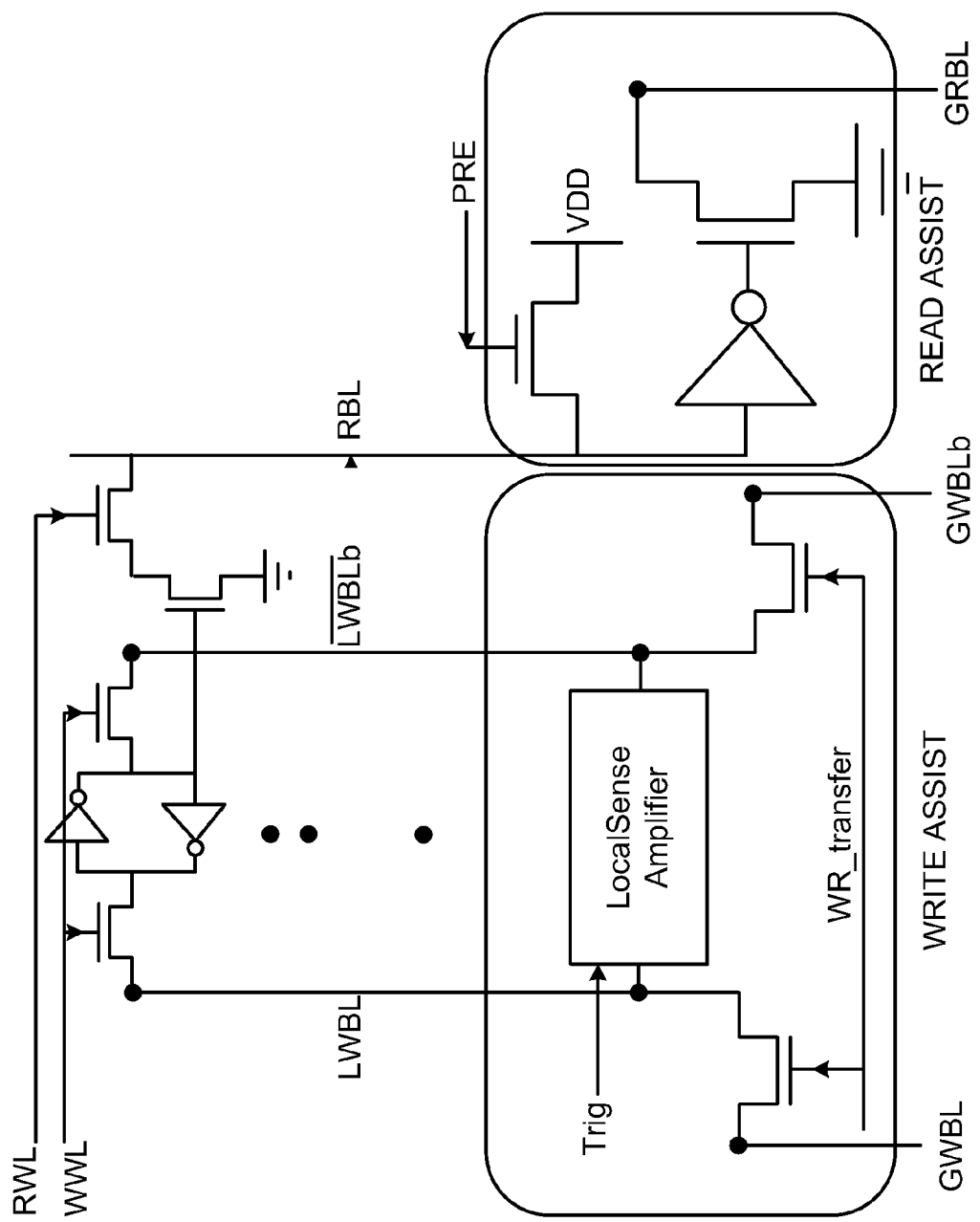
FIG. 1 shows a schematic view of conventional local assist circuitry for an 8T SRAM device.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn to scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, various embodiments which may be referred to as "preferred" are to be construed as exemplary manners in which the disclosure may be implemented rather than as limiting the scope of the disclosure.

The term "comprising," used in the claims, should not be interpreted as being restricted to the elements or steps listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

I. Introduction

In general, SRAM devices as known in the art may experience the following advantages and disadvantages.

Read-decoupled 8T SRAM cells offer a higher degree of variability resilience compared to 6T SRAM cells, but at the expense of an increased area overhead. The 8T SRAM cell area overhead may tail off with technology scaling, advanced technology nodes of 32 nm may witness 8T SRAM cell area comparable to the 6T SRAM cell. The desire for scaled operating voltages and use of low power technologies for low power designs may require the use of upsized READ stack transistors. Therefore, comparison of the 8T SRAM cell at the constant value of read current could result in an increased size of READ stack transistors, thereby dwindling the scaling of the 8T SRAM cell. Secondly the write margin (WM) improvement with read-decoupled 8T SRAM cells at scaled voltage levels is not that significant, compared to the read stability. Thirdly the low swing bit-line (global write bit lines) reduces the READ energy consumption but the WRITE energy consumption is not optimized as the WRITE operation requires full voltage swing on the local write bit-lines of an accessed SRAM cell. Therefore WRITE energy consumption is more critical than the READ energy consumption and is a vital issue for realizing ultra low energy SRAMs. The key for reducing WRITE energy lies in reducing the voltage swing on the bit-lines. Half swing during the WRITE operation reduces the WRITE energy consumption theoretically by 75%. Further reduction of the voltage swing on the highly capacitive bit-lines is limited by the degraded WM for the scaled technologies at the lower voltages. A new SRAM cell design—a sense amplifying cell SRAM (SAC-SRAM)—has been recently proposed which can achieve a 90% reduction in WRITE energy consumption but the area overhead is very high. In addition to the area overhead of SAC-SRAM, the GND connection via NMOS transistor degrades the read static noise margin (SNM) and reduces the cell read current. The conventional hierarchical bit-lines with local sense amplifiers achieve low energy WRITE operation (FIG. 1). The low swing data information on the highly capacitive global bit-lines is first transferred onto the short local bit-lines by access transistors. Then the local sense amplifier resolves this low swing information to a full voltage level (swing) on the low capacitive local bit-lines. The low swing data information on high capacitive global bit-lines and full swing voltage signal on the low capacitive local bit-lines reduces the energy consumption of the WRITE operation. The presence of local sense amplifier as a local write assist in memory requires complex memory matrix optimization and also the area overhead is high. The area penalty can be limited by sharing the local write receiver and reusing the logic circuit used for the READ operation. However the complex memory matrix optimization, the increasing mismatch offset of the local write receiver and the increased timing complexity are left unaddressed. The size of the transistors in the local sense amplifier acting as a local write receiver is dictated by the mismatch offset voltage and the speed requirement. The minimum value of low swing data information for the global bit-lines that can be resolved reliably to the full swing voltage levels on short local bit-lines is limited by the mismatch offset of the local write receiver. The conventional way of reducing the mismatch offset requires the upsizing of the local write receiver transistors. This directly translates into increased energy consumption and the area penalty of the local write receiver. Secondly, the traditional strobed local write receiver requires several critical timing signals that must be applied in a sequential order with sufficient margins. First, the low swing data is transferred from the global bit-lines onto the local bit-lines, then the local write receiver is triggered only when the low swing voltage is more than the mismatch offset of the local write receiver. This requires an expensive timing circuitry and also introduces significant timing margins thereby increasing the access time.

Below, certain embodiments of the present disclosure are presented—in particular SRAM devices although this disclosure is not restricted thereto—which introduce various circuit techniques to address some or all above-mentioned issues:

1) A novel low-swing write mechanism enables low energy WRITE operation:
   a) non-strobed local write receiver (NS-LWR) can solve the issues associated with existing state of the art strobed local write receivers (LWR);
   b) differential VSS (DVSS) bias on the NS-LWR for offset mitigation compounds into dual action for improving write margin (WM) of the accessed SRAM cells.
2) A local read buffer can compensate degraded read current ($I_{read}$) and achieve high performance.
3) An 8T SRAM cell type structure of the local assist circuitry (NS-LWR, WR MUX and local read buffer) can result in litho friendly implementation thereby reducing the area overhead compared to the conventional local assist circuitry.

II. Novel Low-Swing Write Mechanism

A. Architecture

Figure 2:
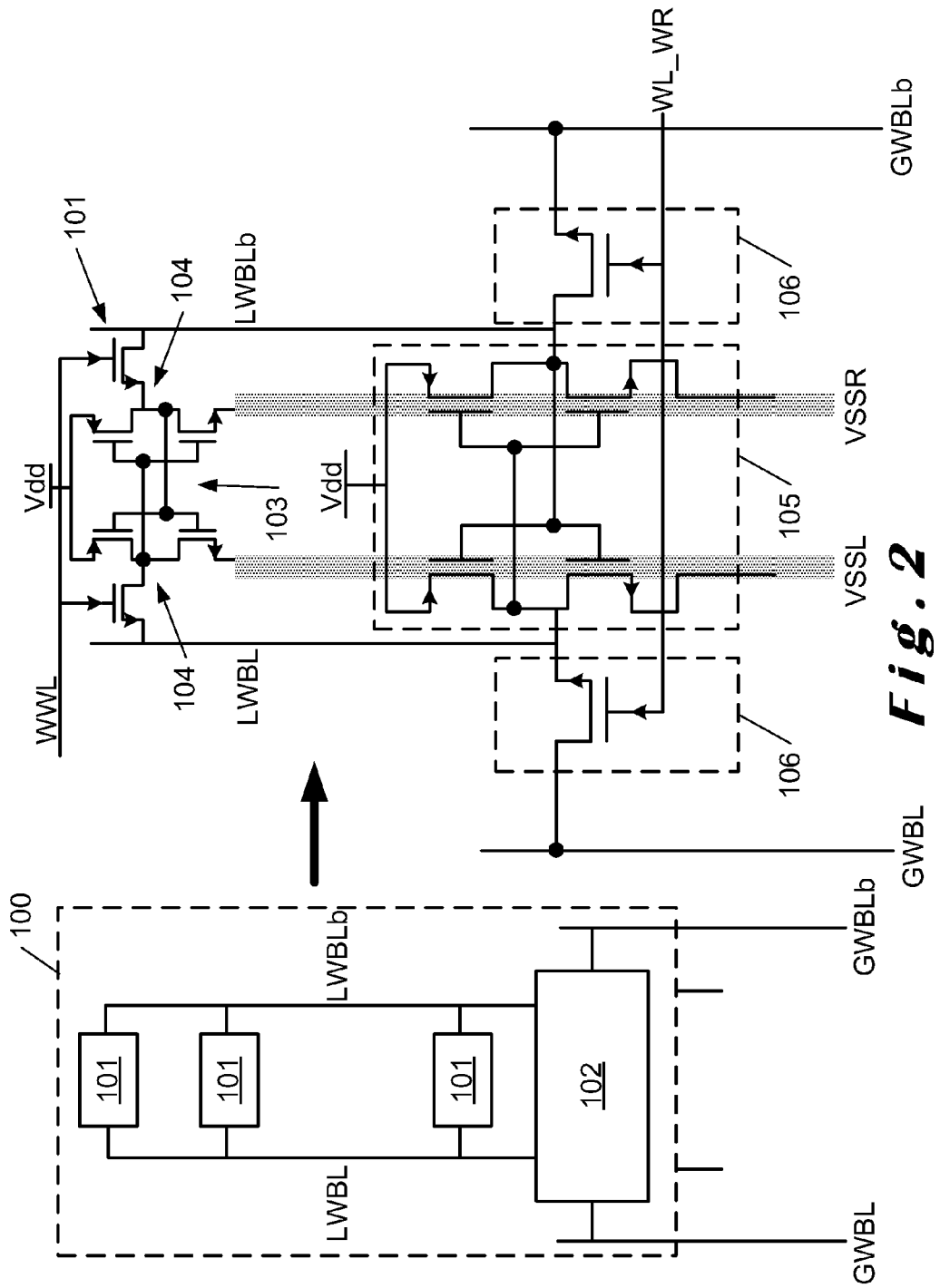
FIG. 2 shows a schematic view of an embodiment of write assist circuitry according to this disclosure, in particular a non-strobed local write receiver with differential VSS biasing.

In our architecture (see FIG. 2) we propose to replace the strobed local write receiver with a "non-strobed local write receiver," NS-LWR 102, comprising two cross coupled inverters 105, which may reduce the timing complexity associated with strobe signal generation of a conventional local write receiver. The WL_WR write activation signal for the access transistors 106 of this NS-LWR not only transfers the low swing information onto the local bit-lines but also serves the purpose of triggering the regenerative action of the two cross coupled inverters 105. The WL_WR signal may be pulsed in order to isolate the nodes of the cross coupled pair from the highly capacitive global bit-lines, which are in this case global write bit-lines GWBL, GWBLb. This architecture may also implement the DVSS biasing technique, which allows the independent tuning of the GND connection of the cross coupled inverters 103 of the SRAM cells 101 and those 105 of the NS-LWR. The SRAM cells 101 and NS-LWR 102 have connections to left and right vertical GND rails, i.e. VSSL and VSSR. The data dependent bias application on VSSL and VSSR for the offset cancellation of the local write receiver 102 can also improve write-ability of the accessed SRAM cells 101 as discussed in II.C below.

B. Operation

Figure 3:
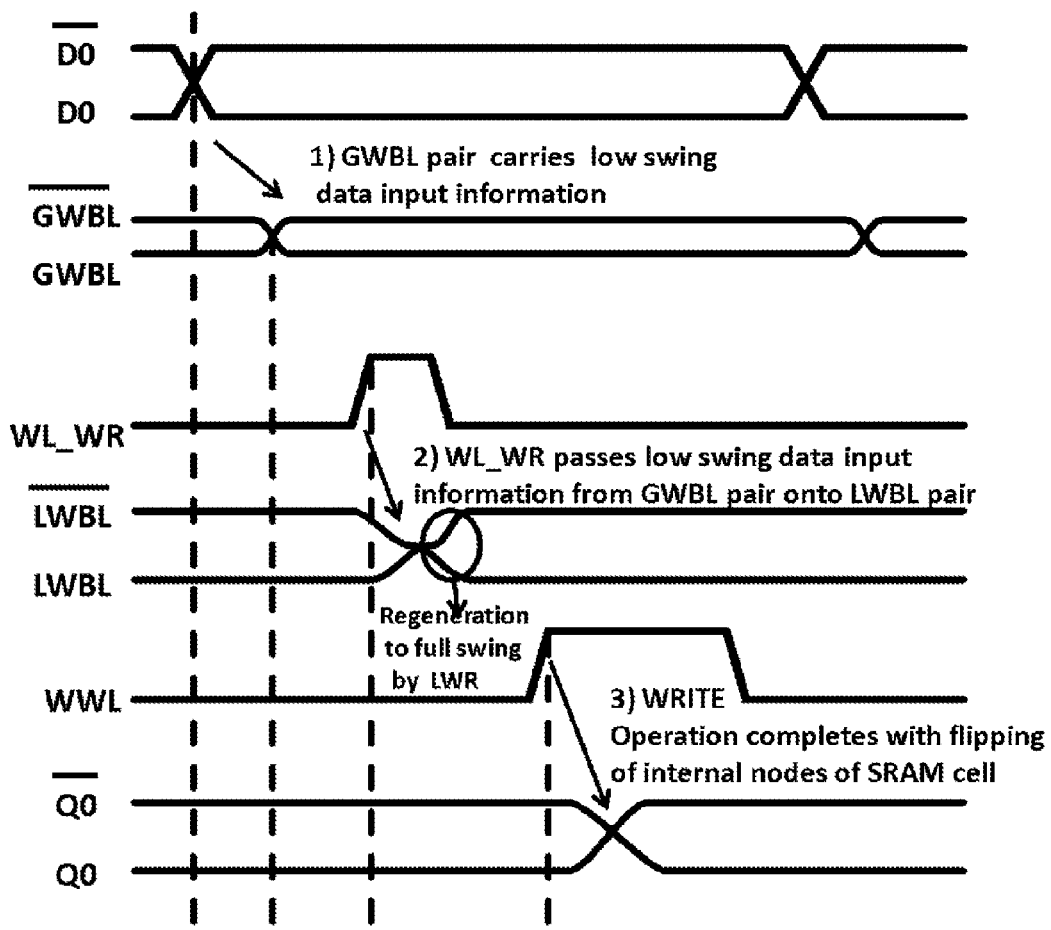
FIG. 3 shows a write operation according to an embodiment of this disclosure.

The WRITE operation is described below with reference to FIG. 3.

Figure 4:
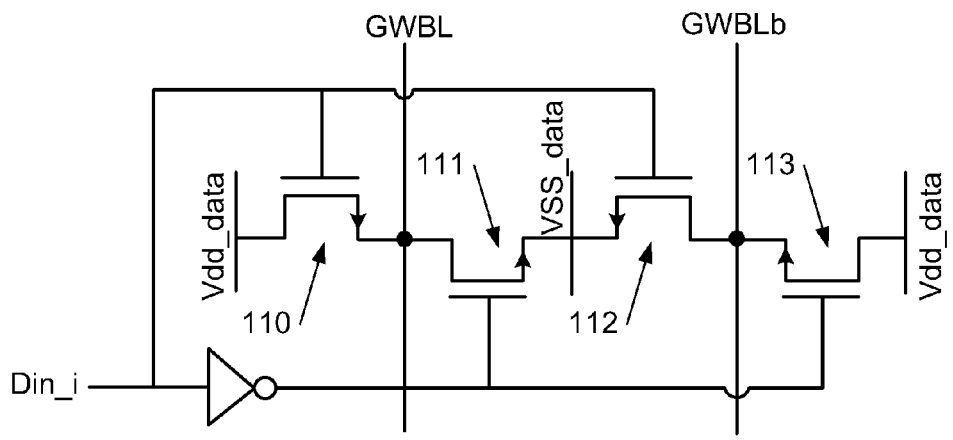
FIG. 4 shows an embodiment of low swing write drivers for an SRAM device according to this disclosure.

Low swing write drivers 110-113 (see FIG. 4) may be used to transfer the data input information (complementary data input signals D0, D0b in FIG. 3 correspond to single data input signal Din_i and the inverted Din_i by the inverter in FIG. 4) as low swing signals on the global write bit-lines pair GWBL and GWBLb. Then the pulsed WL_WR signal activates the access transistors 106 of the activated local column, transferring low swing data information from the highly capacitive global write bit-lines onto the local write bit-lines pair LWBL and LWBLb. The regenerative action of the two cross coupled inverters 105 of the NS-LWR 102 converts this low swing data information to the full voltage swing on the short local write bit-lines, so the accessed SRAM cell 101 sees full swing on the local bit-lines. Finally the write word line WWL activation signal operates the cell access transistors 104 to complete the WRITE operation, flipping the internal nodes Q0, Q0b (nodes "L" and "H" in FIG. 6b) of the accessed SRAM cell.

Figure 5:
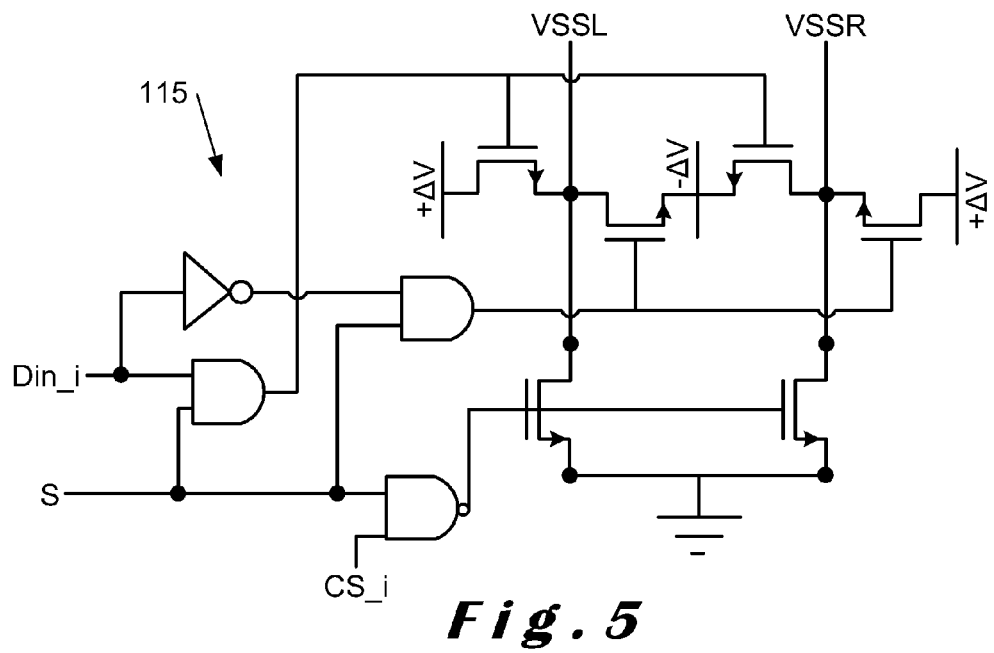
FIG. 5 shows an embodiment of a VSS biasing circuit for an SRAM device according to this disclosure.

For use with scaled VDD levels DVSS biasing may be applied by means of a VSS biasing circuit 115 (FIG. 5). For low voltage levels an external SRAM macro pin (S_signal) and the data input signal Din_i are combined by means of logic to put data dependent bias on the GND lines, connecting VSSL and VSSR to $+\Delta V$ and $-\Delta V$ respectively.

C. Variability Resilience

Process variations can easily lead to write failures either due to sensing failure of the local write receiver or because of the degraded write-ability of the accessed SRAM cell. If MUP of the cross coupled inverter pair 105 of the local write receiver 102 becomes strong and MUPb becomes weak (FIG. 6a) due to process variations, then the risk of sensing failure increases (for writing "0"). Similarly, if MUP of the SRAM cell 101 becomes stronger and Mpass becomes weaker (FIG. 6b), then the discharge of the node "H" becomes more difficult and the write-ability of the SRAM cell decreases.

The impact of transistor sizing in improving write-ability can be very prominent at the high supply voltage levels but at the low supply voltage levels the impact of transistor sizing can be very limited in advanced CMOS technologies. Therefore, a write assist scheme is preferred to ensure SRAM cell write-ability at the scaled supply voltage levels. There are a number of write assist techniques available to solve the degraded write-ability viz. boosted WL and lowering Cell VDD. Functional effectiveness is the most important parameter in the evaluation of the applied write assist technique. But at the same time the added power consumption and area overhead is an equally important parameter. Increased process variations for advance sub-nanometric nodes often make it necessary to use more than one assist technique, in order to preserve the functionality of the SRAM cell. Use of more than one assist technique not only increases the design complexity but also results in an increased area and power consumption overhead.

In certain embodiments of this disclosure, the DVSS bias enabled NS-LWR provides a combined solution for realizing variability resilience low energy WRITE operation (FIG. 6a). The application of DVSS bias connects VSSL to $+\Delta v$, so MUP becomes weak and connection of VSSR to $-\Delta v$ increases the strength of MUPb. Thus, the mismatch offset is reduced and the sensing failure is avoided. DVSS biasing of 0.1 V reduces the sigma V offset by 25%, based on the importance sampling simulations at VDD of 0.55 V. The DVSS bias also generates two write assist techniques viz. selective VSS raising and Negative BL mechanism for the accessed SRAM cell 101 (FIG. 6b). The $+\Delta v$ positive VSS bias applied to VSSL weakens MUP of "H" side of the SRAM cell thereby improving write-ability of the accessed SRAM cell. The $-\Delta v$ negative VSS bias applied on VSSR has two advantages. First, it makes the rise time faster during the WRITE operation thereby improving the write access time, $-0.1$ V of DVSS bias results in 24% improvement for the slow NMOS and slow PMOS process corner. Second, it pulls the bit-line below GND level ($-\Delta v$) and generates the negative bit-line for the accessed SRAM cell 101 without any extra added cost. It has been found that the selective VSS raising and Negative BL mechanism can increase the SRAM cell write-ability and reduce the probability of write failure for the worst corner (slow NMOS and fast PMOS) by a factor of $10^3\times$ at the scaled VDD levels.

III. Local Read Buffer

The access speed is dominantly dependent on the rate at which the accessed SRAM cell discharges the bit-line. The read current Iread is severely impacted by the increased process variations with technology scaling. In the conventional high performance SRAMs, memory cells are placed in local hierarchy with connection to short local bit-lines (FIG. 1). The small sized SRAM cell has to discharge only a small capacitance. The local read bit line LRBL swing is then transferred onto global bit-lines through a static or dynamic local read buffer. The presence of the logic gates not only increases area but also results in complex memory matrix optimization.

Figures 7, 8:
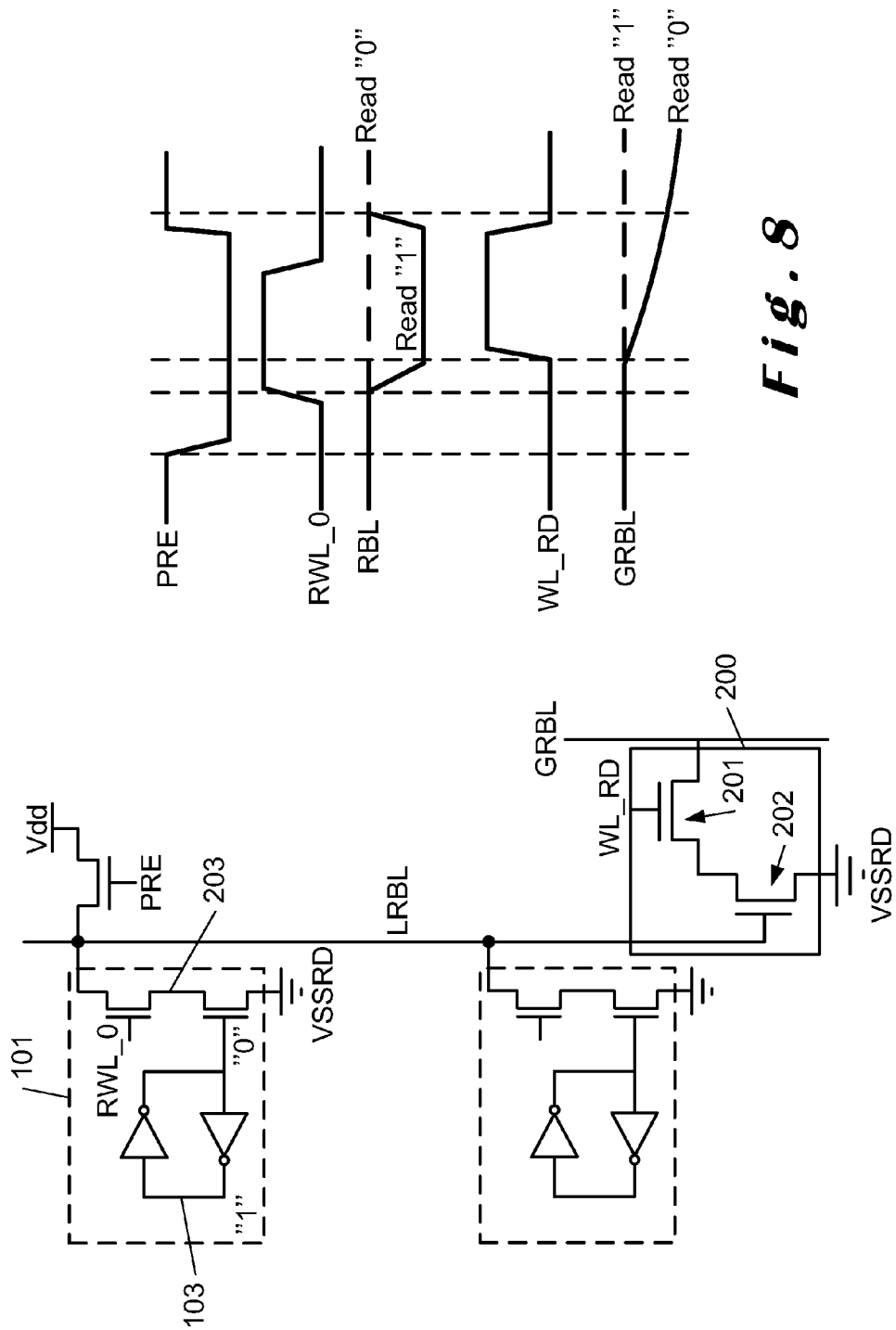
FIG. 7 shows a schematic view of an embodiment of read assist circuitry according to this disclosure, in particular an upsized two stack low voltage threshold NMOS read buffer with a structure similar to that of the 8T SRAM cell read buffer.
FIG. 8 shows a read operation according to an embodiment of this disclosure.

In certain embodiments of this disclosure, the problem is remedied by inserting a read buffer 200 similar to the 8T SRAM cell read buffer 203 (FIG. 7). The local read buffer 200 comprises two stacked upsized low voltage threshold (LVT) NMOS transistors 201, 202 and delivers more current compared to the minimum sized high VT (HVT) read buffer 203 of an accessed SRAM cell 101 and improves the access speed. The upsized two stack LVT NMOS transistor 200 along with the write assist circuitry, i.e. 105, 106, used during WRITE offers a higher degree of flexibility in memory matrix optimization as discussed in section IV, resulting in area reduction compared to conventional assist circuits.

The sources of the 8T SRAM cell read buffers 203 and local read buffer 200 (upsized LVT transistors) are both connected to VSSRD, which is preferably kept floating for all non-accessed matrix columns. The floating VSSRD and low swing pre charge voltage for GRBL can minimize the leakage power.

The READ operation is as follows (FIG. 8). The local read bit-line LRBL is precharged to Vdd, i.e. PRE. The matrix column for an accessed SRAM cell 101 is activated by connecting its VSSRD port to GND. An 8T SRAM cell 101 is asserted by activating its cell read buffer 203, by means of the RWL_0 signal. The asserted 8T SRAM cell 101 discharges the local read bit-line LRBL depending on the stored data information. Then the local read buffer 200 is activated by WL_RD signal. The local read buffer 200 transfers the information from LRBL to GRBL to be sensed by the global sense amplifiers.

IV. Local Assist Circuit Layout

The physical regularity of SRAM layout enables the use of litho optimized specialized DRC design rules. The advantage of ultra regular layout of SRAM matrix in achieving area reduction is evident. However, achieving the same benefit from the logic circuit is difficult because the logic circuit layout tends to be irregular. As a result the conventional logic circuit based local assist techniques complicate the litho optimization of the memory matrix.

The local assist circuitry as proposed in certain embodiments of this disclosure, consisting of NS-LWR 105, access transistors 106 and local read buffers 200 can be mapped onto regular design fabric, similar to SRAM cells. The components of the local assist circuitry consisting of two cross coupled inverters 105 of the local write receiver, two NMOS access transistors 106 and the two stack NMOS transistor 200 of the local read buffer resembles an 8T SRAM cell. Further, the additional NMOS pre charge transistor for the local read bit line can be implemented in the local read buffer region. Hence, the proposed local assist circuitry can facilitate shape-level regularity requirements to take advantage from the litho optimization. Enforcing shape-level regularity for litho optimization is a difficult task with the existing conventional local assist techniques. Therefore the 8T SRAM cell type implementation of the proposed local assist circuitry can offer enhanced flexibility for embedding the logic circuit into the memory matrix at a reduced area cost.

V. Simulation Results

A. Write Margin Improvement of SRAM Cell

As mentioned above, DVSS bias applied generates selective VSS raising and a negative bit-line mechanism. VSS raising weakens the MUP and the negative bit line increases the strength of the Mpass gate thereby improving the write ability. It has been found that a data dependent ±0.1 V DVSS bias can result in a 2.5× improvement in the write trip point for the worst slow NMOS and fast PMOS corner.

B. Energy Consumption

It has been found that the energy consumption can be 10× less compared to the conventional full swing bit-lines. In conventional SRAM designs highly capacitive non hierarchical bit-lines with all the SRAM cells connected (512 cells) are switched full swing whereas in the design of this disclosure full swing voltage levels are used only for the local bit-lines connected to e.g. 16 cells and there are e.g. 32 such local blocks connected to low swing highly capacitive global bit-lines. The NS-LWR 102 used in local hierarchy for the amplification of low swing data input information can reduce the timing complexity associated with the existing state of the art LWR. Secondly the litho friendly SRAM cell type layout can enable compact layout, thereby reducing bit-line wire capacitances. This can directly lead to a reduction in energy consumption. It has been found that the energy consumption per bit of the design of this disclosure for the column height of 512 cells with 32 local blocks (16 cells per local block) can be 40% less compared to the existing state of the art similar sized LWR for the fast NMOS and fast PMOS process corner.

C. Access Time for READ Operation

Upsized LVT read buffer 200 in the local hierarchy delivers more current compared to the HVT small sized read buffer of 8T SRAM cell. It has been found that this can result in on average a 6.5× improvement in READ access speed for the worst slow NMOS and slow PMOS process corner.

D. AREA Reduction

Considering the best effort layout of the strobed LWR and of the non-strobed LWR integrated in a local bit slice with 16 SRAM cells per local bit-line, it has been found that the area overhead of the solution of this disclosure can be only 9% compared to 38% with the existing solutions. Firstly, the non-strobed LWR can reduce the transistor count compared to the conventional strobed LWR. Secondly DVSS bias applied for the offset mitigation can further relax the transistor sizing requirement compared to the conventional LWR. Thirdly the SRAM cell type structure of the non-strobed LWR 105 and associated access transistors 106 and the local read buffer 200 enables compact pitch matched layout. It has been found that, as a result, the design according to this disclosure can achieve a 31% reduction in the area overhead compared with the conventional local assist circuitry.

VI. Conclusion

The local assist circuit techniques described in this disclosure can solve the issues of increased mismatch offset and degraded write-ability associated with the increased device variations at the scaled voltage levels for the advance sub-nanometric technologies and can achieve an ultra low energy operation. NS-LWR can reduce the transistor count and timing complexity associated with the conventional strobed LWR. DVSS bias application can mitigate the impact of mismatch offset, therefore the probability of sensing failure can be much reduced. Reduced timing complexity and transistor sizes can reduce the energy consumption of NS-LWR compared to the conventional LWR. The WRITE energy consumption improvement can be 10× compared to the conventional full swing bit-lines and 40% less compared to the existing state of the art techniques. DVSS bias applied on NS-LWR can result in negative bit-line on the VSS side of local bit-line and selective VSS raising. Therefore the actual cell to be written can experience two write margin improvement techniques together, namely VSS raising and Negative BL at the only cost of DVSS bias applied to the NS-LWR. The upsized LVT local read buffer can reduce the READ access time by 6.5× and the use of low swing GRBL and floating VSSRD can reduce the leakage. The area overhead of this solution can be only 9% compared to 38% with the existing solutions. The physical regularity in the layout of the local assist circuitry can permit the litho optimization thereby eliminating the memory matrix sub array design complexity associated with the placement of logic circuits. Thus the proposed circuit techniques can provide a strong area-energy-performance optimization compared to existing solutions.

What is claimed is:

1. A memory device comprising at least one local column of memory cells, each local column comprising:
    complementary local bit lines between which a plurality of the memory cells are connected, each cell being connected to a write word line for addressing the cell;
    a local write receiver via which the complementary local bit lines are connectable to complementary global bit lines, the local write receiver being configured for creating a full voltage swing on the complementary local bit lines from a reduced voltage swing on the complementary global bit lines, the local write receiver comprising:
        a connection mechanism provided for connecting the complementary local bit lines to the complementary global bit lines and thereby passing on the reduced voltage swing; and
        a pair of cross-coupled inverters directly connected to the complementary local bit lines and configured to convert the reduced voltage swing, passed on by the connection mechanism, to the full voltage swing on the complementary local bit lines, wherein the cross-coupled inverters of the local write receiver have connections to left and right ground rails for receiving left and right VSS biases, wherein the memory device further comprises a VSS biasing circuit configured for applying the left and right VSS biases to the left and right ground rails, and wherein the VSS biasing circuit is configured to establish a predetermined, data dependent voltage difference between the left and right VSS biases.

2. The memory device according to claim 1, wherein the memory device comprises a static random access memory device, and wherein:
   the cross-coupled inverters of the local write receiver are second cross-coupled inverters;
   each cell comprises a pair of first cross-coupled inverters connectable via first access transistors to the complementary local bit lines for writing the cell, the gates of the first access transistors of each cell being connected to the write word line for addressing the cell; and
   the connection mechanism comprises second access transistors, the gates of the second access transistors being connected to a local column write enable line for receiving a local column write enable signal.

3. The memory device according to claim 2, wherein the second cross-coupled inverters are upsized with respect to the first cross-coupled inverters.

4. The memory device according to claim 2, further comprising a timing signal generator configured to generate a pulsed signal as the column write enable signal.

5. The memory device according to claim 1, wherein the voltage difference is in the range of 0.05V-0.20V.

6. The memory device according to claim 1, wherein the first cross-coupled inverters also have connections to the left and right ground rails for receiving the left and right VSS biases.

7. The memory device according to claim 1, further comprising reduced swing write drivers for transferring data input information as reduced swing signals on the complementary global bit lines.

8. The memory device according to claim 1, wherein the complementary local and global bit lines are write bit lines, wherein the device comprises separate local and global read bit lines for read operations, wherein each memory cell is connectable via a cell read buffer to the local read bit line, and wherein the local read bit line is connectable via a local read buffer to the global read bit line.

9. The memory device according to claim 8, wherein the local read buffer comprises two stacked NMOS transistors.

10. The memory device according to claim 9, wherein the two stacked NMOS transistors of the local read buffer are upsized with respect to NMOS transistors in the cell read buffers.

11. The memory device according to claim 9, wherein the two stacked NMOS transistors of the local read buffer are configured for reduced threshold voltage operation with respect to NMOS transistors in the cell read buffers.

12. The memory device according to claim 1, wherein the memory device comprises an embedded dynamic random access memory device.

13. An electronic device comprising a memory device according to claim 1.

14. A method for writing a memory cell of a local column of a memory device, comprising the steps of:
   applying a reduced voltage swing to complementary global bit lines of the device;
   connecting complementary local bit lines of the local column, between which the memory cell is connected, to the complementary global bit lines using a local write receiver;
   creating, using the local write receiver, a full voltage swing on the complementary local bit lines from a reduced voltage swing on the complementary global bit lines;
   write enabling the local column;
   addressing the cell by means of a write word line to which the cell is connected, wherein the step of creating the full voltage swing from the reduced voltage swing is performed by a pair of cross-coupled inverters of the local write receiver directly connected to the complementary local bit lines; and
   applying left and right VSS biases with a predetermined, data dependent voltage difference between the left and right VSS biases to the cross-coupled inverters of the local write receiver.

15. The method according to claim 14, wherein the memory device is a static random access memory device, and wherein the step of addressing the cell comprises connecting a pair of first cross-coupled inverters of the cell to the complementary local bit lines by means of first access transistors, the gates of which are connected to the write word line.

16. The method according to claim 14, wherein the step of write enabling the local column comprises applying a pulsed signal to a local column write enable line to which the gates of second access transistors of the local write receiver are connected.

17. The method according to claim 14, wherein the memory device is an embedded dynamic random access memory device.

18. A system for writing a memory cell of a local column of a memory device, the system comprising:
   means for applying a reduced voltage swing to complementary global bit lines of the device;
   means for connecting complementary local bit lines of the local column, between which the memory cell is connected, to the complementary global bit lines;
   means for creating a full voltage swing on the complementary local bit lines from a reduced voltage swing on the complementary global bit lines, the means for creating comprising a pair of cross-coupled inverters of a local write receiver directly connected to the complementary local bit lines and configured to convert the reduced voltage swing to the full voltage swing on the complementary local bit lines;
   means for write enabling the local column; and
   means for addressing the cell by means of a write word line to which the cell is connected and means for applying left and right VSS biases with a predetermined, data dependent voltage difference between the left and right VSS biases to the cross-coupled inverters of the local write receiver.

* * * * *

UNITED STATES PATENT AND TRADEMARK OFFICE
CERTIFICATE OF CORRECTION

PATENT NO. : 8,958,238 B2  
APPLICATION NO. : 14/015822  
DATED : February 17, 2015  
INVENTOR(S) : Sharma et al.

Page 1 of 1

It is certified that error appears in the above-identified patent and that said Letters Patent is hereby corrected as shown below:

Title page, (item 73, Assignees) at line 2, change "Kathoieke" to --Katholieke--.

Title page, (item 56, Other Publications) at line 10, change "Wlley-interscience," to --Wiley-interscience,--.

In the specification

Column 1 at line 33, change "save," to --save--.

In the claims

Column 12 at line 52, in Claim 18, after "column;" delete "and".

Column 12 at line 54, in Claim 18, change "connected" to --connected;--.

Signed and Sealed this  
Twenty-seventh Day of October, 2015

Michelle K. Lee  
*Director of the United States Patent and Trademark Office*